(12) United States Patent
Shi

(10) Patent No.: US 7,888,688 B2
(45) Date of Patent: Feb. 15, 2011

(54) THERMAL MANAGEMENT FOR LED

(75) Inventor: Wei Shi, San Jose, CA (US)

(73) Assignee: Bridgelux, Inc., Livermore, CA (US)

( * ) Notice: Subject to any disclaimer, the term of this patent is extended or adjusted under 35 U.S.C. 154(b) by 378 days.

(21) Appl. No.: 12/111,812

(22) Filed: Apr. 29, 2008

(65) Prior Publication Data

US 2009/0267086 A1  Oct. 29, 2009

(51) Int. Cl.
H01L 27/15 (2006.01)
H01L 29/26 (2006.01)
H01L 31/12 (2006.01)
H01L 33/00 (2006.01)

(52) U.S. Cl. .................. 257/79; 257/431; 257/676; 257/E51.022; 257/E25.019; 257/E25.032; 349/20; 349/21; 349/58

(58) Field of Classification Search .............. 257/79, 257/431, 676, E51.022, E25.019, E25.032; 349/20, 21, 58
See application file for complete search history.

(56) References Cited

U.S. PATENT DOCUMENTS 5,643,830 A  7/1997  Rostoker et al.
7,157,745 B2  1/2007  Blonder et al.
7,470,938 B2  12/2008  Lee et al.
7,625,104 B2 *  12/2009  Zhang et al. .............. 362/294
2002/0003232 A1 *  1/2002  Ahn et al. .................. 257/81
2004/0026708 A1  2/2004  Chen
2005/0006659 A1  1/2005  Ng et al.
2006/0226437 A1  10/2006  Fujita et al.
2007/0007558 A1  1/2007  Mazzochette
2007/0090383 A1  4/2007  Ota et al.
2007/0121023 A1 *  5/2007  Yang ......................... 349/58
2008/0054280 A1  3/2008  Reginelli et al.
2009/0268470 A1 *  10/2009  Okimura et al. ........ 362/311.02

OTHER PUBLICATIONS

PCT search report of Nov. 2, 2009 for PCT/US09/56401.

* cited by examiner

*Primary Examiner*—Michelle Estrada
(74) *Attorney, Agent, or Firm*—Haynes and Boone, LLP

(57) ABSTRACT

A method and system for removing heat from an LED facilitates the fabrication of LEDs having enhanced brightness. A thermally conductive interposer can be attached to the top of the LED. Heat can flow through the top of the LED and into the interposer. The interposer can carry the heat away from the LED. Light can exit the LED though an at least partially transparent substrate of the LED. By removing heat from an LED, the use of more current through the LED is facilitated, thus resulting in a brighter LED.

13 Claims, 8 Drawing Sheets

THERMAL MANAGEMENT FOR LED

TECHNICAL FIELD

The present invention relates generally to light emitting diodes (LEDs). The present invention relates more particularly to methods and systems for providing thermal management for LEDs.

BACKGROUND

Light emitting diodes (LEDs) are well known. LEDs are semiconductor devices that emit light when the p-n junction thereof is forward biased. LEDs are commonly used as indicator lights on electronic devices. For example, the red power indicator on consumer electronic devices is often an LED.

The use of LEDs in higher power applications is increasing. For example, LEDs are being used in applications such as flashlights, displays, and area lighting. However, the brightness of an LED is limited, as least in part, by the ability of the LED to dissipate heat. Brighter LEDs require increased current. Increased current inherently results in increased heating of the LED.

As an LED gets hotter, its efficiency decreases. Thus, in order to take advantage of the increased current, the heat resulting therefrom must be managed, e.g., removed from the LED. Excessive heat also reduces the life of an LED.

In view of the foregoing, it is desirable to provide a method and system for managing heat in LEDs and the like.

BRIEF SUMMARY

A method and system are disclosed herein for removing heat from an LED. Removing heat facilitates the fabrication of brighter LEDs. According to an example of an embodiment, a thermally conductive interposer can be attached to the top of the LED. Heat can flow through the top of the LED and into the interposer. The interposer can carry the heat away from the LED.

More particularly, in accordance with an example of an embodiment an LED assembly can comprise at least one LED device and an interposer to which the LED devices are attached via a top of the LED devices.

According to an example of an embodiment, a method for fabricating an LED assembly can comprise providing an interposer and attaching at least one LED device to the interposer. The LED devices can be attached to the interposer via a top of the LED devices.

According to an example of an embodiment, a method for removing heat from an LED can comprise facilitating heat flow from the LED through a top thereof. The heat flows into a thermally conductive interposer which then functions as a heat sink and thus dissipates the heat.

By removing heat from an LED, the use of more current through the LED is facilitated, thus resulting in a brighter LED.

This invention will be more fully understood in conjunction with the following detailed description taken together with the following drawings.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
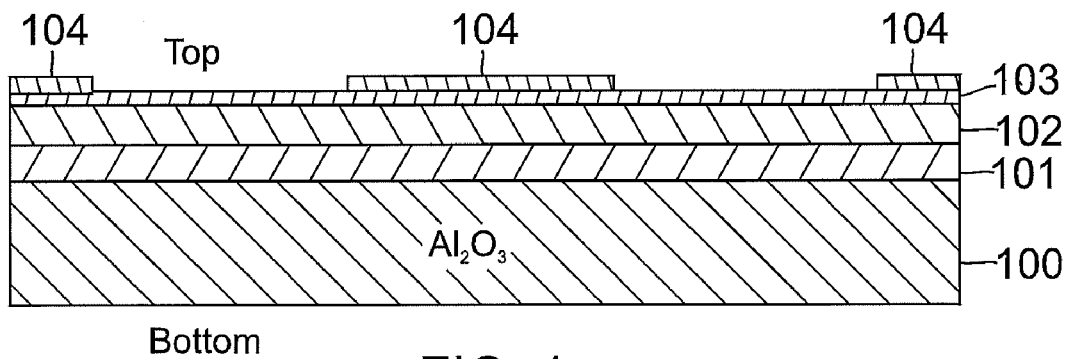
FIG. 1 is a semi-schematic, cross-sectional side view of a substrate upon which a light emitting diode (LED) is being fabricated, showing the application of masking according to an example of an embodiment.

A method and system for fabricating brighter LEDs is disclosed. Enhanced brightness is achieved, at least in part, by fabricating LEDs that are suitable for use with increased current flow therethrough. Increased current flow is facilitate by better extracting heat from the LEDs. In this manner, the overheating that undesirably reduces LED efficiency and also undesirable reduces the life of and LED is substantially mitigated.

According to an example of an embodiment, an LED assembly can comprise one or more LED devices that are attached to an interposer. Each LED device has an active region. As those skilled in the art will appreciate, the active region is comprised of two differently doped semiconductors.

The interposer can comprise a thermally conductive material. The interposer can conduct heat away from the LED devices such that increased current can be used with the LEDs. Such removal of heat from the LEDs desirably results in enhanced brightness and longevity of the LEDs.

The LED devices can be attached to the interposer by soldering the LED devices to the interposer. Reflow soldering can be used to attach the LED devices to the interposer, for example. Other methods can be used to attach the LED devices to the interposer. For example, the LED devices can be adhesively bonded to the interposer, such as via the use of epoxy.

A passivation layer can be formed on the top of the LED devices. The LED devices can be attached to the interposer by soldering the passivation layer of the LED devices to the interposer.

Electrical contacts can be formed on sides of the LED devices. The LED devices can be attached to the interposer by soldering the electrical contacts of the LED devices to corresponding electrical contact formed upon the interposer.

The interposer comprises a metal-core interposer. For example, the interposer can comprise a metal-core ceramic interposer. As a further example, the interposer can comprise an Al/Cu interposer. The interposer can comprise any material or combination of materials that provide sufficient heat conduction away from the LED devices.

The interposer can have one or more openings formed therein. Each of the openings can be configured to receive one or more LED devices. The LED devices can be completely or partially recessed within the opening. Electrical contacts that are complimentary to those of the LED devices can be formed completely within or partially within the opening. Such electrical contacts of the opening can facilitate electrical communication between the LED devices and the interposer. The interposer can have conductive conduits, such as traces, formed thereon for providing electric current to the LED devices.

The interposer can be configured to facilitate handling, transport, and/or mounting of the LED devices. For example, the interposer can be configured to facilitate mounting of a plurality of LED devices in a flashlight.

At least one spring can be formed proximate the openings for facilitating attachment of the LED devices to the interposer. For example, a spring can be formed upon two opposing sides of an opening such that the springs tend to grab or compress an LED device therebetween. The springs can facilitate electrical contact between the LED devices and the interposer. For example, the springs can be formed of a metal, such as copper, and the springs can electrically connect the LED device in contact therewith to conductive traces formed upon the interposer. Alternatively, one or more of the springs can not facilitate electrical contact between the LED devices and the interposer.

As mentioned above, the LED devices can be attached to the interposer, at least in part, by reflow soldering. Reflow soldering can be used to attach the LED devices to the interposer at the sides of the LED device, as well as at the top thereof. The reflow soldering at the sides of the LED device can provide electrical connection to the interposer.

A plurality of LED devices can be attached to a single interposer. A plurality of LED devices can be received within a single opening of an interposer. For example, the opening of the interposer can be configured as an elongated trench within which a plurality of LED devices can be received. Each opening can receive a single LED device. Each opening can receive any desired number of LED devices. For example, any opening can receive one, two, three, four, or more devices.

A thermally conductive material can be attached to the top of the LED devices. For example, a Si or SiC wafer can be attached to the top of the LED devices so as to better facilitate handling and/or processing thereof. The use of such a top side bonded thermally conductive wafer may be particularly beneficial in those instances wherein the substrate is difficult to etch or otherwise process. The top side bonded thermally conductive wafer can be bonded, such as via reflow soldering, to the interposer, as describe further below.

According to an example of an embodiment, a method for fabricating an LED assembly can comprise providing an interposer and attaching one or more LED devices to the interposer via a top of the LED devices. Light can be extracted from the LED devices through the substrate, e.g., wafer, upon which the LED devices are constructed and/or through the interposer.

According to an example of an embodiment, a method for removing heat from an LED can comprise facilitating heat flow from the LED through a top thereof and into a thermally conductive interposer.

Methods and systems disclosed herein can provide more intimate contact between the active region (the light and heat producing region) of an LED and a heat sink. Such methods and systems can provide a more effective path for heat transfer from an LED.

Referring now to FIG. 1, a substrate 100 can have a light emitting diode (LED) device fabricated thereon. To fabricate the LED device, a first semiconductor layer 101 can be formed upon the substrate and a second semiconductor layer 102 can be formed upon the first semiconductor layer 101. An oxide and/or conductive current spreading layer 103 can be applied to the second semiconductor layer 102. A Mask 104 can be applied to oxide/current spreading layer 103 so as to facilitate etching as described below.

The semiconductors layers 101 and 102 are formed upon a top surface of the substrate 100. Indeed, the top surface of the substrate can be defined herein as that surface of the substrate 100 upon which the semiconductor layers 101 and 102 are formed. The top and bottom of the substrate 100 are labeled in FIG. 1.

The substrate 100 can comprise sapphire ($Al_2O_3$), SiC, ZnO, glass, ceramic, or any combination thereof. The substrate 100 can comprise any desired material.

The substrate can be defined by a wafer, for example. Indeed, the terms "substrate" and "wafer" can be used synonymously herein. Various different sizes of wafers are suitable for defining the substrate 100.

For example, the wafer can have a diameter between approximately ¼ inch and approximately 12 inches. The wafer can have a diameter of approximately 2 inches. The wafer can have a thickness of between approximately 100 microns and approximately 4 millimeters. The wafer can have a thickness of approximately 400 microns.

The first semiconductor layer 101 can comprise p-doped AlNGan, for example. The second semiconductor layer 102 can comprise n-doped AlNGan, for example. Those skilled in the art will appreciate that the first semiconductor layer 101 and the second semiconductor material 102 can comprise various different materials and have various different dopings. The first semiconductor layer 101 and the second semiconductor layer 102 can comprise any desired material.

The mask 104 (as well as other masks discussed herein) can comprise a photoresist. Those skilled in the art will appreciate that various different photoresists materials are suitable. The mask 104 can comprise any desired material. The mask 104 can protect the oxide/current spreading layer 103 during subsequent etching.

Figure 2:
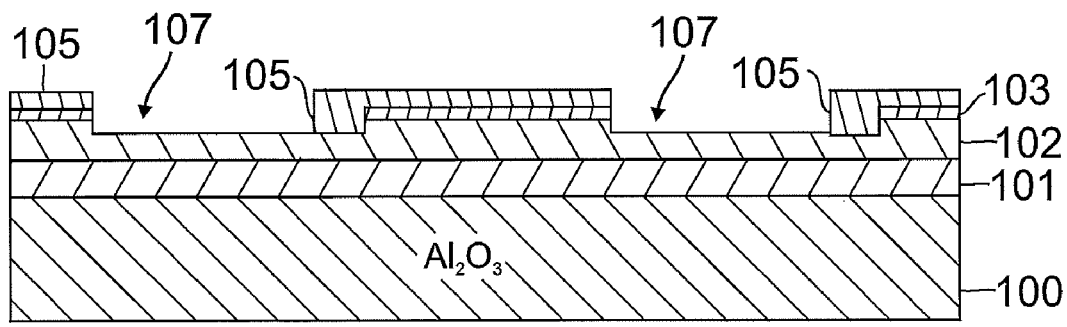
FIG. 2 is a semi-schematic, cross-sectional side view of a substrate upon which an LED is being fabricated, showing etching and the application of masking according to an example of an embodiment.

Referring now to FIG. 2, the substrate 100 of FIG. 1 is shown after etching into the second semiconductor layer 102 and after an additional mask 105 has been added. The additional mask 105 protects the oxide/current spreading layer 103 and a portion of the second semiconductor layer 102 during subsequent etching. The protected portion of the second semiconductor layer 102 will be used for electrical contact, as discussed below. Etching into the second semiconductor layer 102 begins the formation of an opening 107. Opening 107, when fully formed as shown in FIG. 5, separates adjacent LED devices from one another.

Figure 3:
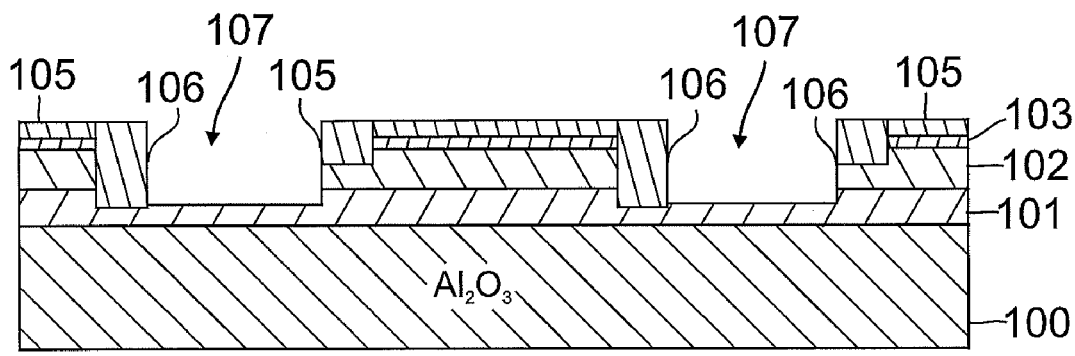
FIG. 3 is a semi-schematic, cross-sectional side view of a substrate upon which an LED is being fabricated, showing etching and the application of masking according to an example of an embodiment.

Referring now to FIG. 3, the substrate 100 of FIG. 2 is shown after etching through the second semiconductor layer 102 and into the first semiconductor layer 101 so as to further define, e.g., deepen, the opening 107. Additional masking 105 has been applied to protect the current spreading layer 103, the second semiconductor layer 102, and a portion of the first semiconductor layer 102 during subsequent etching. Protected portions of the first semiconductor layer 101 and the second semiconductor layer 102 will be used for electrical contact, as discussed below.

Figure 4:
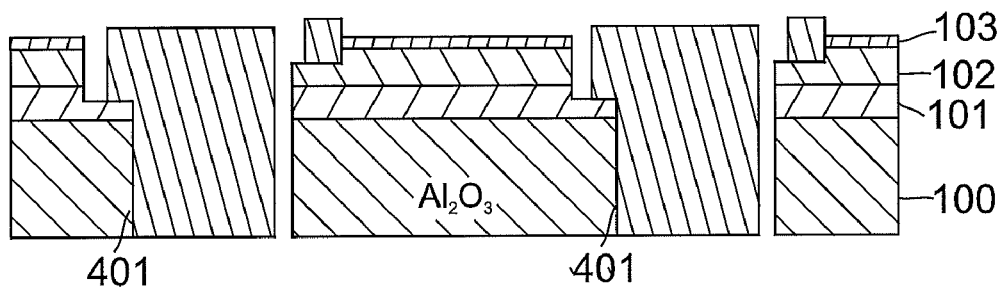
FIG. 4 is a semi-schematic, cross-sectional side view of a substrate upon which an LED is being fabricated, showing the application of masking according to an example of an embodiment.

Referring now to FIG. 4, the substrate 100 of FIG. 3 is shown after etching completely through the substrate 100 and after the application of additional mask 401. Mask 401 defines a pattern for the application of dielectric 501, as discussed below.

Figure 5:
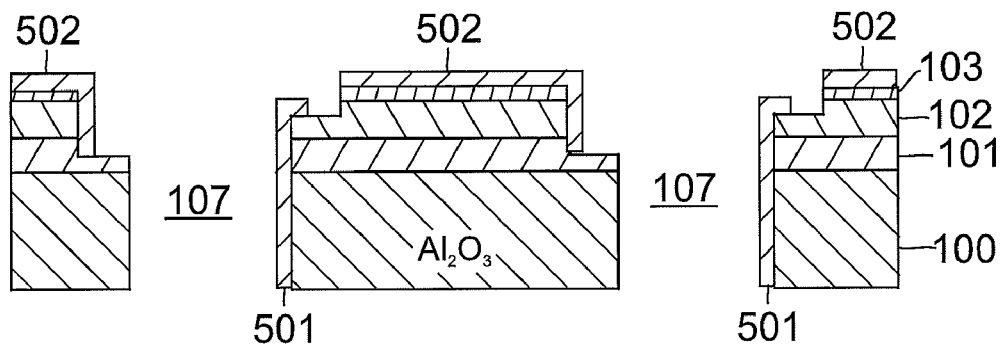
FIG. 5 is a semi-schematic, cross-sectional side view of a substrate upon which an LED is being fabricated, showing dielectric growth and mask stripping according to an example of an embodiment.

Referring now to FIG. 5, the substrate 100 of FIG. 4 is shown after dielectric layers 501 and 502 have been grown upon the oxide/current spreading layer 103 and within the opening 107. Masks 104, mask 105, mask 106, and mask 401 have been stripped.

Figure 6:
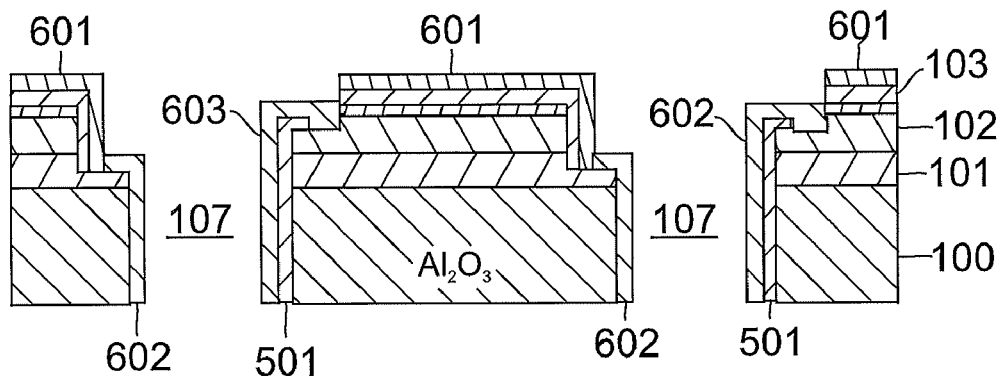
FIG. 6 is a semi-schematic, cross-sectional side view of a substrate upon which an LED is being fabricated, showing masking and the application of Ti/Cu plating according to an example of an embodiment.

Referring now to FIG. 6, the substrate 100 of FIG. 5 is shown after the application of mask 601 and after the application of Ti/Cu plating 602 and Ti/Cu plating 603. The Ti/Cu plating 602 and Ti/Cu plating 603 can define electrical contacts that facilitate current flow through the LED.

Figure 7:
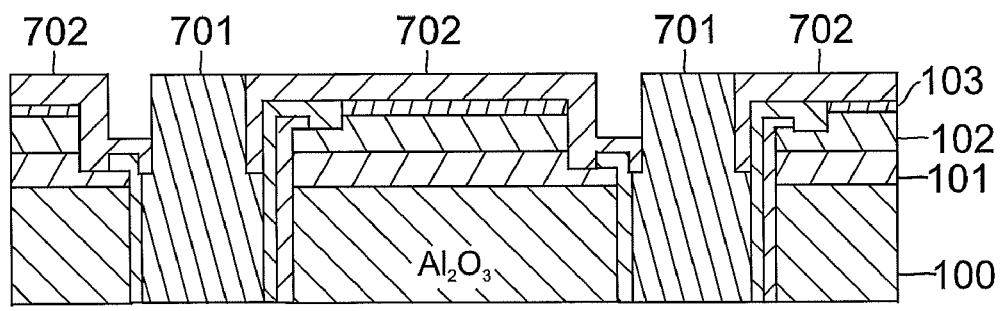
FIG. 7 is a semi-schematic, cross-sectional side view of a substrate upon which an LED is being fabricated, showing application of passivation according to an example of an embodiment.

Referring now to FIG. 7, the substrate 100 of FIG. 6 is shown after the application of passivation 702. The passivation 702 can comprise a dielectric material, such as $SiO_2$. The passivation 702 can comprise any other desired material. Mask 701 fills opening 107 to prevent the application of passivation therein.

Figure 8:
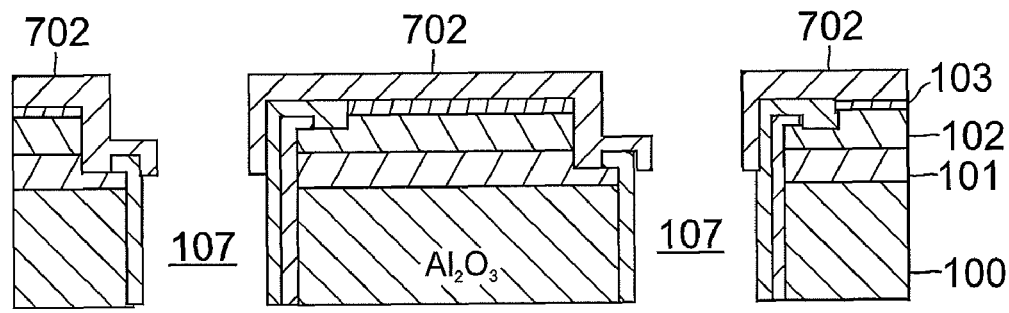
FIG. 8 is a semi-schematic, cross-sectional side view of a substrate upon which an LED is being fabricated, showing mask stripping according to an example of an embodiment.

Referring now to FIG. 8, the substrate 100 of FIG. 7 is shown after mask 701 has been stripped therefrom. Stripping mask 701 leaves openings 107 open again so as to facilitate further processing, as discussed below.

Figure 9:
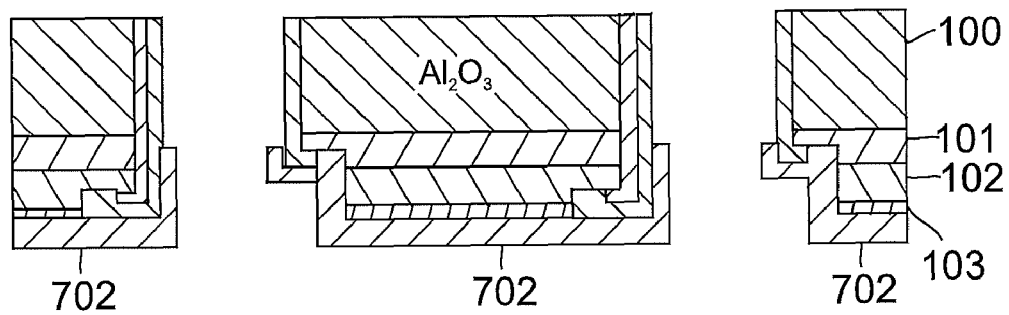
FIG. 9 is a semi-schematic, cross-sectional side view of a substrate upon which an LED is being fabricated, showing the wafer flipped according to an example of an embodiment.

Referring now to FIG. 9, the substrate 100 of FIG. 8 is shown after inverting or flipping the substrate 100. The substrate 100 can be temporarily attached to a transport support (not shown) to facilitate handling and transport thereof, as is well known in the art.

Figure 10:
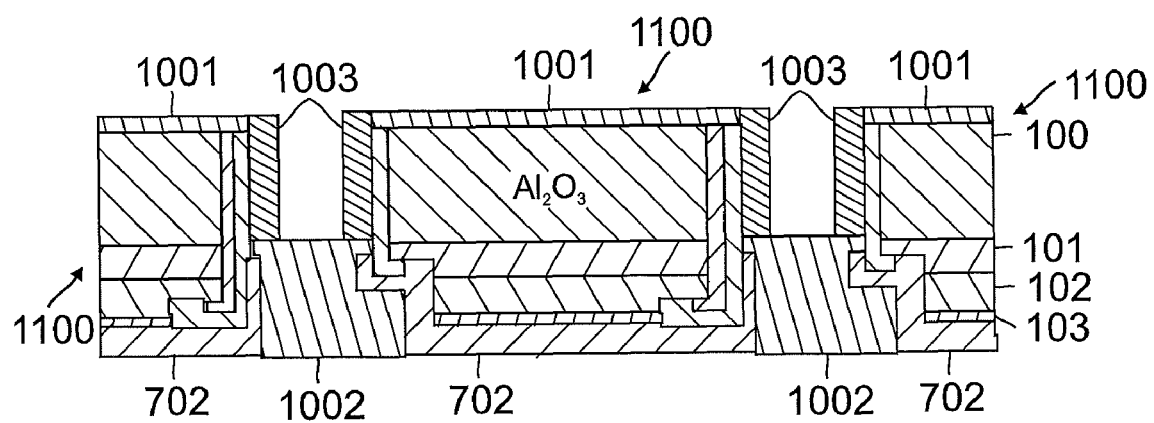
FIG. 10 is a semi-schematic, cross-sectional side view of a substrate upon which an LED is being fabricated, showing masking and Ni/solder plating on a sidewall according to an example of an embodiment.

Referring now to FIG. 10, the substrate 100 of FIG. 9 is shown after the application of mask 1001 and mask 1002. Ni/solder plating 1003 has been applied to the sidewalls of opening 1007. Mask 1001 and mask 1002 prevent the application of Ni/solder plating on the top and bottom surfaces of the LED device.

Figure 11:
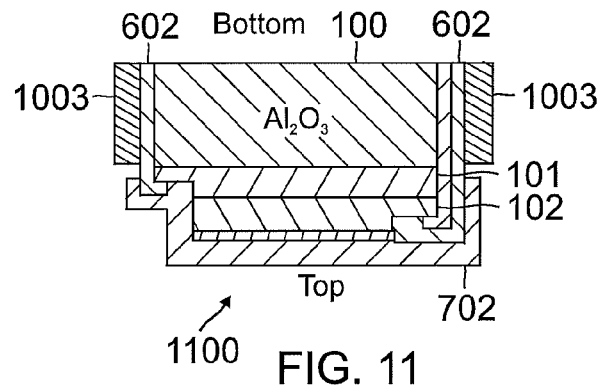
FIG. 11 is a semi-schematic, cross-sectional side view of an inverted (flipped) substrate upon which an LED is being fabricated (defining a device), showing mask stripping and wafer detachment according to an example of an embodiment.

Referring now to FIG. 11, the substrate 100 of FIG. 10 is shown after the mask 1001 and the mask 1002 have been stripped therefrom. The individual device 1100 has been detached from the remaining devices or wafer, e.g., the wafer has been diced. As those skilled in the art will appreciate, various methods can be used for dicing the wafer. For example, a dicing saw can be used to dice the wafer. A plurality of such devices 1100 are typically produced during the fabrication process. Each device 1100 can substantially define an LED.

Figure 12:
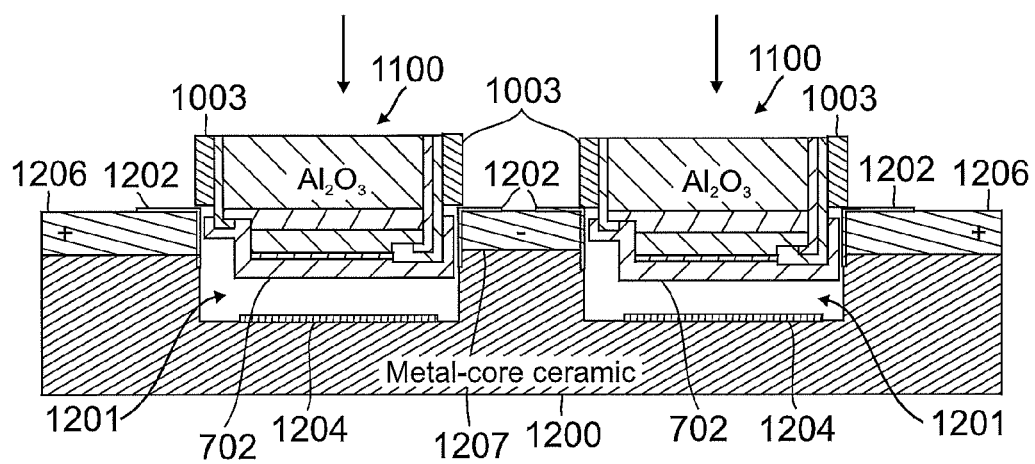
FIG. 12 is a semi-schematic, cross-sectional side view of an inverted device as the device is being inserted into a metal-core ceramic/Si interposer according to an example of an embodiment.
Figure 13:
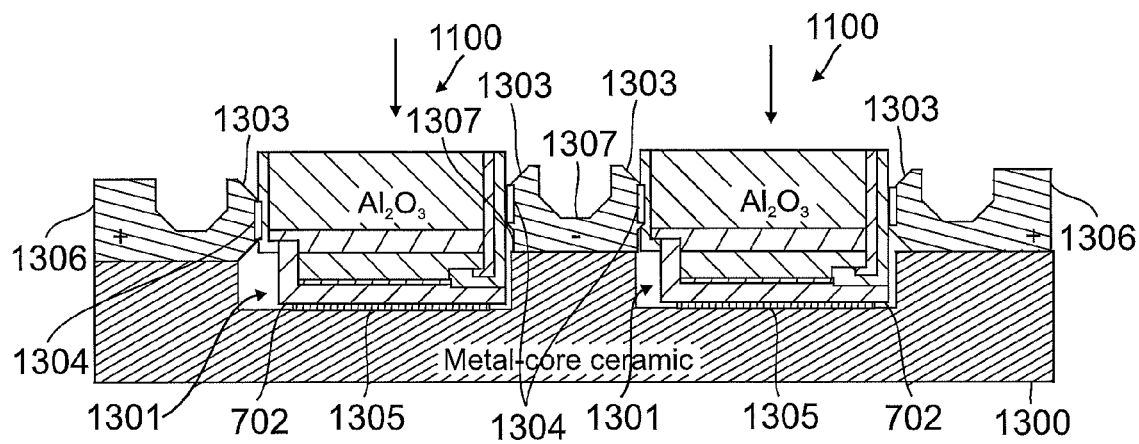
FIG. 13 is a semi-schematic, cross-sectional side view of an device after the device has been fully inserted into a metal-core ceramic/Si interposer having metal (such as Cu) springs according to an example of an embodiment.

Referring now to FIGS. 12 and 13, two different ways are shown for attaching the devices 1100 to a heat dissipating substrate or interposer. The heat dissipating substrate or interposer can be a metal-core ceramic interposer. FIG. 12 shows the devices 1100 being initially attached to the interposer via a friction fit or slip fit. As shown in FIG. 12, little or no lateral or compressive force is applied to the LED devices 1100 once they are fully inserted into openings 1201. That is, no springs structures are explicitly defined for providing such force. By way of contrast, FIG. 13 shows the devices 1100 being initially attached to the interposer via a spring fit. Spring structures are explicitly defined for applying this spring force. In both instances, the devices can be more permanently attached to the heat dissipating substrate, such as via reflow soldering as described below.

With particular reference to FIG. 12, two LED devices 1100 such as those of FIG. 11 can be urged into openings 1201 formed in metal-core ceramic interposer 1200. As the LED devices 1100 enter openings 1201, the Ni/solder plating 1003 of the devices 1100 contacts gold plated corners 1202. The size of the LED devices 1100 can be slightly larger than the size of the openings 1201 such that the Ni/solder plating 1003 must deform slightly when the LED devices 1001 are inserted into the openings 1201 so as to assure desired mechanical contact of the LED devices 1001 with the interposer 1200, so as to assure desired electrical contact of the LED devices 1001 with the interposer 1200, and so as to assure desired thermal contact of the LED devices 1001 with the interposer 1200.

After the devices 1100 have been fully inserted into the interposer 1200, then the devices 1100 and the interposer 1200 can be heated so as to effect solder reflow to mechanically, and thermally connect the devices 1100 to the interposer 1200 via thermal interface material (TIM) solder 1204. Alternatively, solder reflow can be performed before the devices 1100 have been fully inserted into the interposer 1200, as discussed below. Solder reflow can effect mechanical, electrical, and thermal connection at the interfaces of the Ni/solder plating 1003 with the gold plated corners 1202.

Thermal interface material solder 1204 can be pre-deposited upon the bottoms of the openings 1201. Solder reflow can effect mechanical connection of the passivation 702 with the thermal interface material solder 1204. Thus, multiple paths are provided for heat flow from the LED device 1100 into the interposer 1200. Heat can flow from the LED device 1100 into the interposer 1200 via the thermal interface material solder 1204 connection at the top of the inverted LED device 1100. Heat can flow from the LED device 1100 into the interposer 1200 via the Ni/solder plating 1003 on the sides of the LED device 1100. Intimate mechanical contact of the devices 1100 with the interposer 1200 facilitates such heat transfer from the devices 1100 into the interposer 1200.

The LED devices 1100 can be placed generally as shown in FIG. 12 prior to reflow soldering. During reflow soldering, the devices 1100 can fall into the openings 1201 such that the passivation 702 is soldered to the interposer 1200 via TIM solder 1204. Force can be applied to the LED device 1100 prior to, during, and/or after reflow soldering to assure that the LED devices are properly seated within the openings 1201 of the interposer 1200.

Conductive traces 1206 and conductive traces 1207 formed upon the interposer 1200 can provide electrical contact from the interposer 1200 to the devices 1100. Thus, conductive traces 1206 and conductive traces 1207 can provide current to the LED devices 1100 to facilitate operation thereof. One set of conductive traces, e.g. conductive traces 1206, can provide positive current flow to the LED device 1100 and the other set of conductive traces, e.g. conductive traces 1207, can provide negative current flow to the LED devices 1100. Conductive traces 1206 and conductive traces 1207 can be formed of copper or any other desired conductive material.

With particular reference to FIG. 13, two devices 1100 such as those of FIG. 11 can be received into openings 1301 formed in metal-core ceramic interposer 1300. Springs, such as copper springs 1303, can apply a lateral or compressive force to devices 1100 so as to tend to hold devices 1100 within openings 1301 and so as to enhance electrical and thermal contact with devices 1100. More particularly, the devices 1100 can be reflow soldered to contacts copper springs 1303 via solder 1304 pre-deposited upon springs.

As discussed with respect to FIG. 12 above, Thermal interface material (TIM) solder 1305 can be pre-deposited upon the bottoms of the openings 1301. Solder reflow can be used to effect mechanical connection of the passivation 702 with the TIM solder 1305.

As discussed above, conductive traces 1306 and 1307 can provide both electrical and thermal contact between the devices 1100 and the interposer 1300. The conductive traces 1306, 1307 and the springs 1303 can be integrally formed. That is, conductive traces 1306, 1307 and the springs 1303 can be formed of the same material and/or layer.

Although FIGS. 12 and 13 show that two devices 1100 can be attached to a single interposer 1200/1300, such is by way of illustration only, and not by way of limitation. Any desired number of devices can be attached to an interposer. For example, one, two, four, eight, or sixteen devices can be attached to a single interposer.

According to an example of an embodiment, devices can be fabricated without etching the sapphire substrate as described above. Such an example of an embodiment is described with reference to FIGS. 14-22 below.

Figure 14:
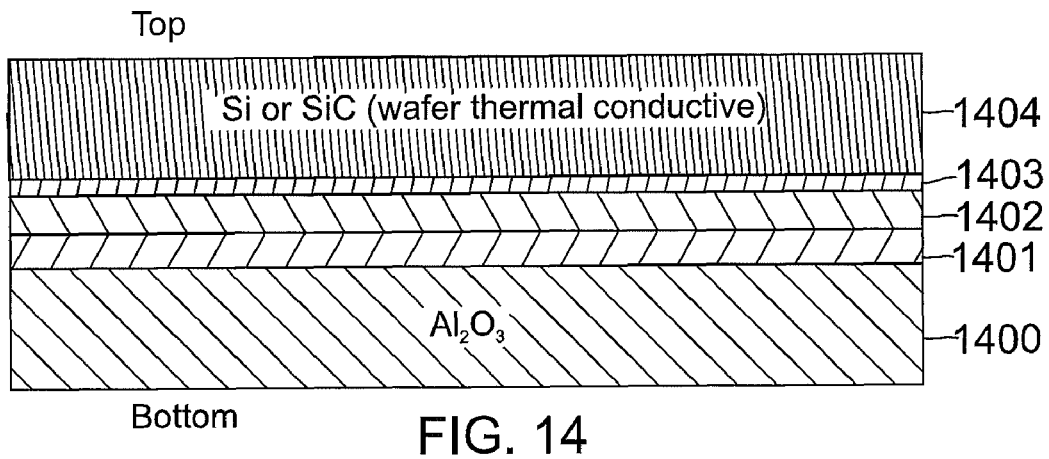
FIG. 14 is a semi-schematic, cross-sectional side view of a substrate upon which a light emitting diode (LED) is being fabricated, showing the use of Si or SiC wafer that is top side bonded to the device according to an example of an embodiment.

Referring now to FIG. 14, a substrate, such as sapphire wafer 1400, can have a first semiconductor layer 1401 formed thereon. A second semiconductor layer 1402 can be formed upon the first semiconductor layer 1401. An oxide/current spreading layer 1403 can be applied to the second semiconductor layer 1402. A thermally conductive material, such as a Si or SiC wafer 1404 can be top side bonded to the sapphire wafer 1400. Wafer bonding of the Si or SiC wafer 1404 to the sapphire wafer 1401 can comprise $SiO_2$—$SiO_2$ wafer bonding.

Figure 15:
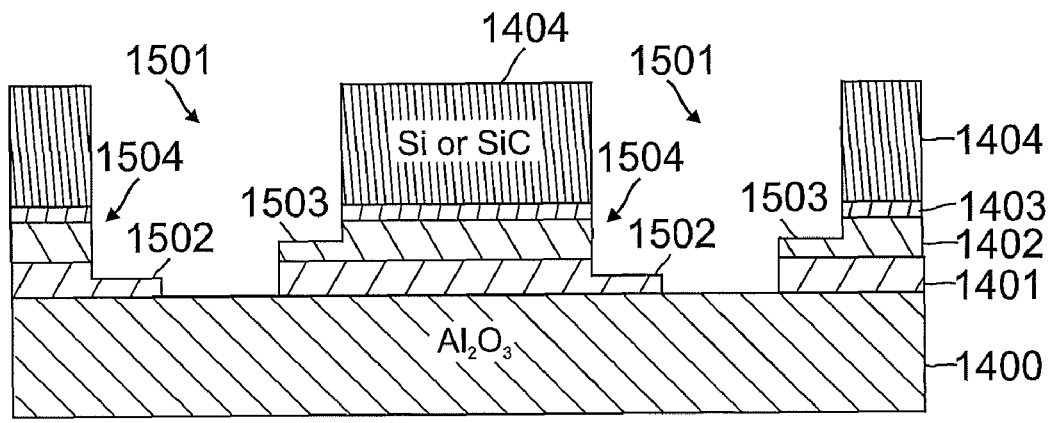
FIG. 15 is a semi-schematic, cross-sectional side view of a substrate upon which an LED is being fabricated, showing the structure obtained through masking and etching according to an example of an embodiment.

Referring now to FIG. 15, masking and etching can be used to form openings 1501 between adjacent LED devices. Contact areas 1502 can be formed in the first semiconductor layer 1401. Similarly, contact areas 1503 can be formed in the second semiconductor layer 1402. The contact areas 1502 and 1503 can be used to facilitated current flow through the LEDs as discussed below.

Masking and etching leaves some thermally conductive wafer 1404 on top of the LED devices 1504. This thermally conductive 1404 can be used to transfer heat from the LED devices as described below.

Figure 16:
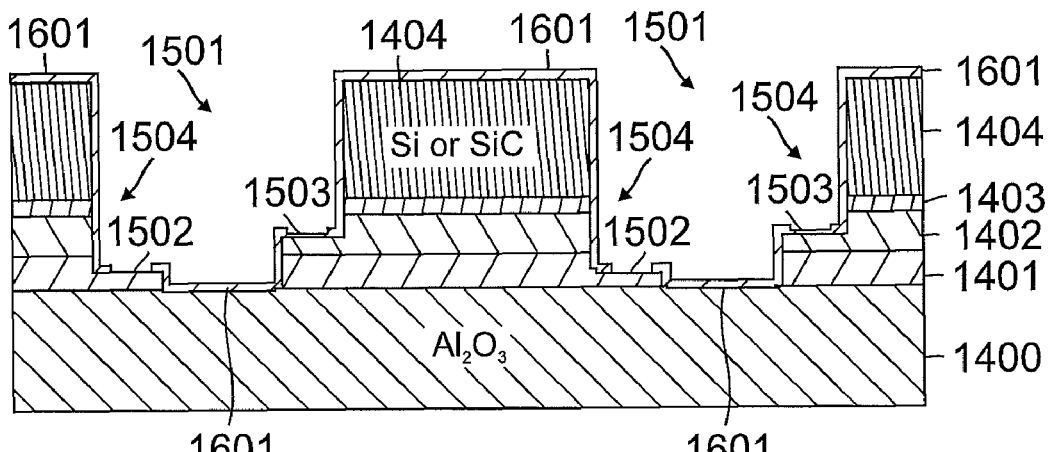
FIG. 16 is a semi-schematic, cross-sectional side view of a substrate upon which an LED is being fabricated, showing the application of dielectric and passivation according to an example of an embodiment.

Referring now to FIG. 16, passivation 1601 can be applied. The passivation can comprise a dielectric, such as $SiO_2$. The passivation 702 can comprise any other desired material. Passivation 1601 can be omitted from at least part of the contact areas 1502 and 1503.

Figure 17:
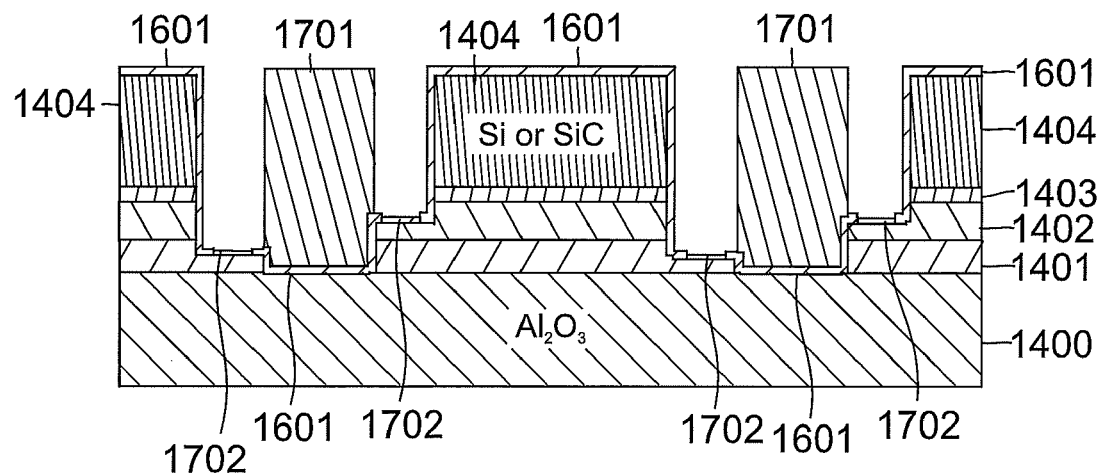
FIG. 17 is a semi-schematic, cross-sectional side view of a substrate upon which an LED is being fabricated, showing the application of a seed layer of Ti/Ta and showing the application of Cu plating according to an example of an embodiment.

Referring now to FIG. 17, mask 1701 can be formed in openings 1501. A seed layer 1702 of Ti/Ta can be applied to contact areas 1502 and 1503. The seed layer 1702 can facilitate the formation of electrical contacts to the first semiconductor layers 1401 and the second semiconductor layers 1402, so as to facilitate current flow through the LED devices 1504.

Figure 18:
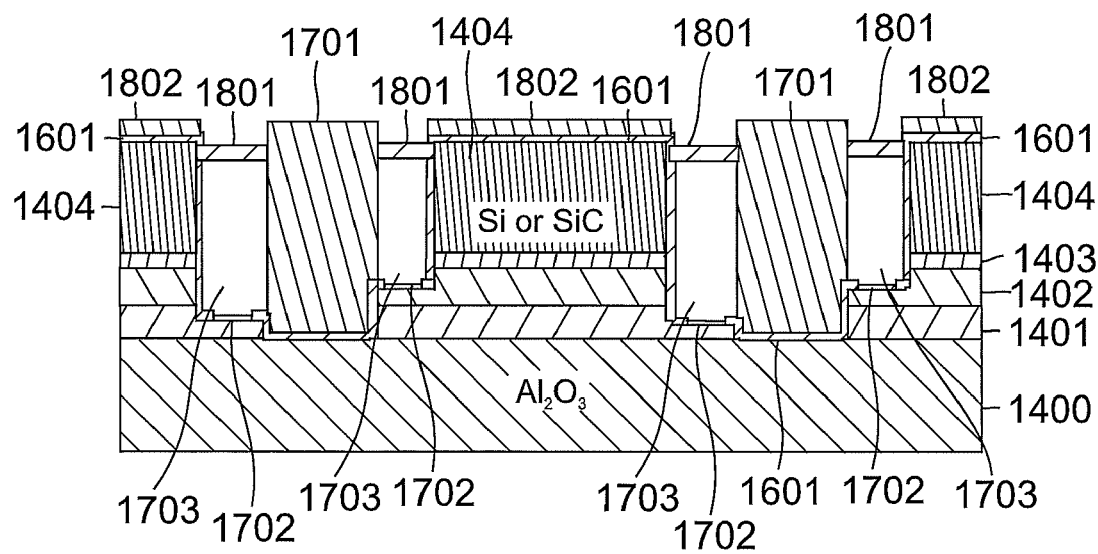
FIG. 18 is a semi-schematic, cross-sectional side view of a substrate upon which an LED is being fabricated, showing Cu etch back and dielectric deposition according to an example of an embodiment.

Referring now to FIG. 18, additional masks 1802 can be formed upon the thermally conductive wafer 1404. Copper plating 1703 can be applied on top of seed layer 1702 to form conductive contacts for the LED devices 1504. The conductive contacts facilitate electrical contact with conductive traces formed upon a thermally conductive substrate, as discussed below.

The copper plating 1703 can be etched back so as to provide a desired height thereof. For example, the copper plating 1703 can be etched back such that it does not extend above the top of the thermally conductive wafer 1404. A dielectric layer 1801 can be formed upon the copper plating 1703.

Figure 19:
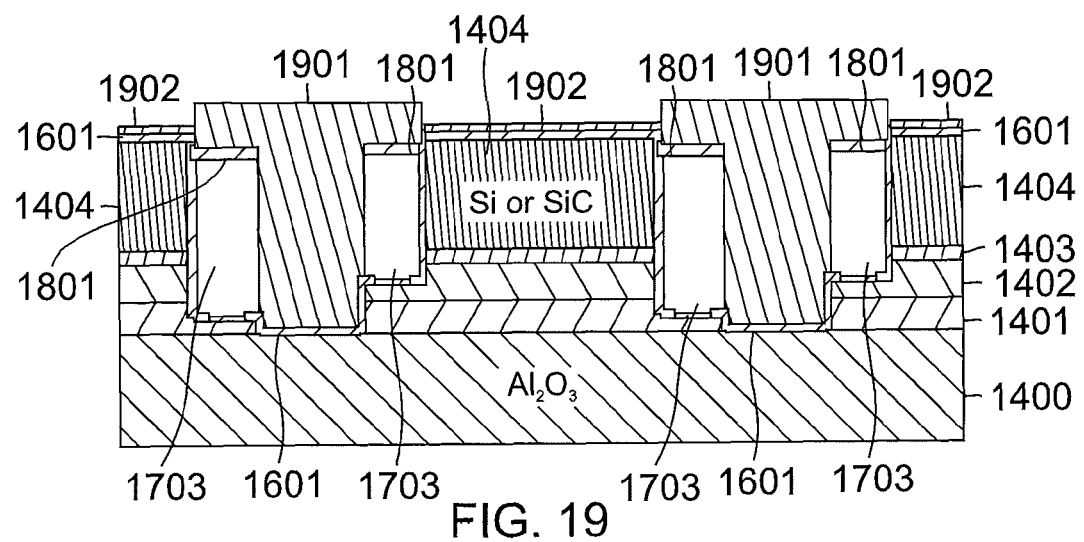
FIG. 19 is a semi-schematic, cross-sectional side view of a substrate upon which an LED is being fabricated, showing solder/Au deposition according to an example of an embodiment.

Referring now to FIG. 19, additional masks 1901 can be formed upon the earlier applied mask 1701 and the dielectric layer 1801. Solder/Au 1902 can then be applied upon the passivation 1601 of the thermally conductive wafer 1404. The solder 1902 can facilitate attachment of the LED device 1504 (FIG. 21) to an interposer 2200 (FIG. 22) as discussed below.

Figure 20:
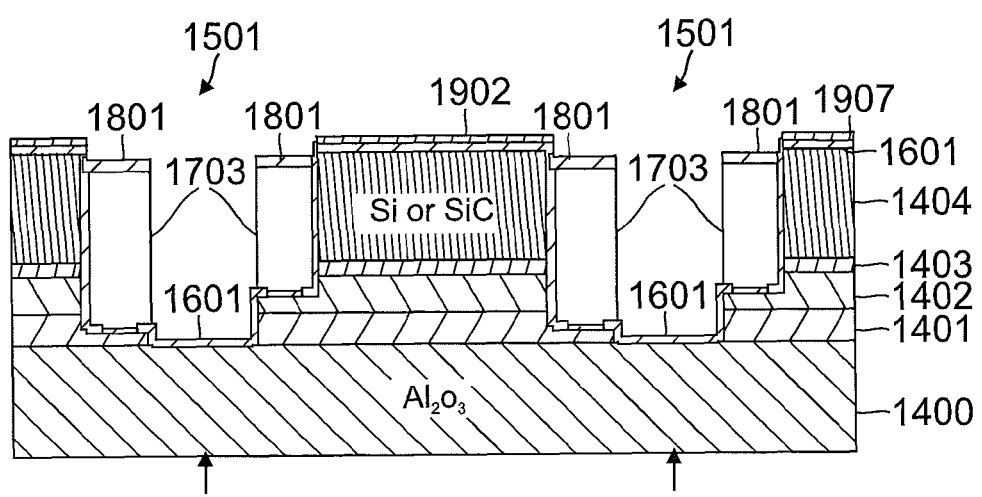
FIG. 20 is a semi-schematic, cross-sectional side view showing a plurality of LED devices on a substrate prior to dicing according to an example of an embodiment.

Referring now to FIG. 20, all masks can be removed in preparation for dicing. As those skilled in the art will appreciate, dicing separates the individual LED devices or die from one another. Dicing can be performed by sawing the substrate 1400, for example.

Figure 21:
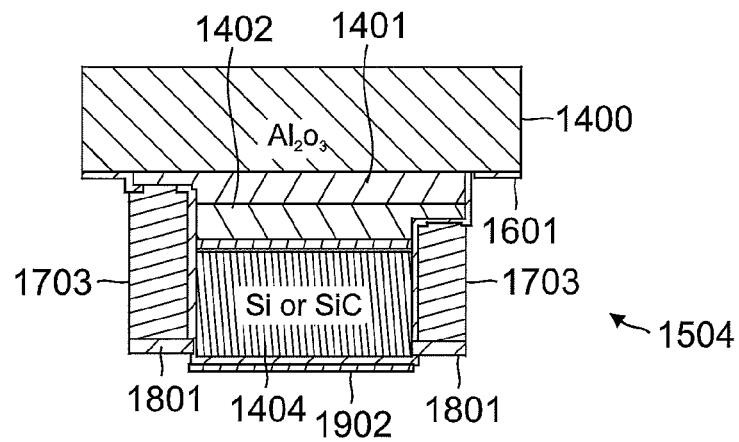
FIG. 21 is a semi-schematic, cross-sectional side view of a flipped LED device according to an example of an embodiment.

Referring now to FIG. 21, a single die or LED device 1504 can be inverted or flipped such that the thermally conductive wafer 1404 portion thereof faces downwardly. Light generated by the LED device can radiate therefrom through the substrate 1400, which is at least partially light transmissive.

Figure 22:
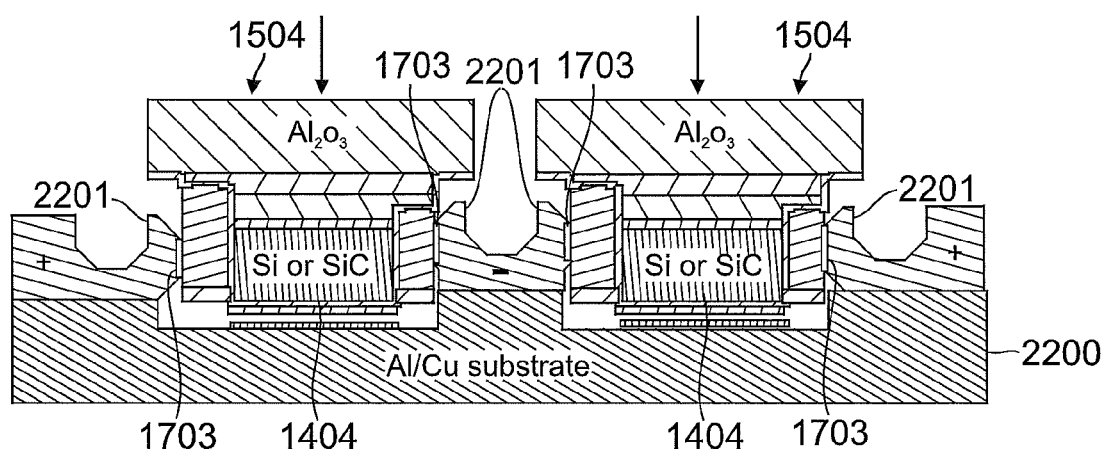
FIG. 22 is a semi-schematic, cross-sectional side view of a plurality of flipped LED devices attached to an interposer.

Referring now to FIG. 22, inverted LED devices 1504 are attached to a thermally conductive interposer 2200. The interposer 2200 can comprise an Al/Cu substrate. The interposer facilitates heat from the devices 1504 as discussed herein.

The interposer 2200 can be configured for a spring fit, similar to that of FIG. 13. Alternatively, the interposer 2200 can be configured for a friction fit, similar to that of FIG. 12. The interposer shown in FIG. 22 is configured for a spring fit and thus comprises springs 2201 that apply a lateral or compressive force to the LED devices 1504. The lateral or compressive force assures good electrical and thermal contact between the interposer 2200 and the LED devices 1504. The lateral or compressive force also tends to hold the LED devices 1504 in place.

Heat from the LED devices 1504 can flow through the Si or SiC substrate 1404 into the interposer 2200. Heat can also flow through copper plating 1703 into interposer 2200. Interposer 2200 allows heat to more readily flow away from the LED devices and thus facilitates heat dissipation for the LED devices.

According to an example of an embodiment, the interposer can be at least partially light transmissive. In this manner, light can exit the LED device through the interposer.

According to an example of an embodiment, the interposer can be at least partially light transmissive and light can exit the LED device both through the substrate at the bottom of the LED device and through the interposer at the top of the LED device. Indeed, light can exit the LED device from the top, bottom, and/or sides thereof.

One or more examples of embodiments facilitate enhance heat extraction from an LED or the like. By better extracting heat from an LED, the use of more current flow through the active region of the LED is facilitated. In this manner, brighter and/or more reliable LED can be made.

Embodiments described above illustrate, but do not limit, the invention. It should also be understood that numerous modifications and variations are possible in accordance with the principles of the present invention. Accordingly, the scope of the invention is defined only by the following claims.

The invention claimed is:

1. An LED assembly comprising:
at least one LED device;
an interposer to which the LED device(s) are attached via a top of the LED device(s); and
a passivation layer formed on the top of the LED devices and wherein the LED devices are attached to the interposer by soldering the passivation layer of the LED devices to the interposer.

2. An LED assembly comprising:
at least one LED device;
an interposer to which the LED device(s) are attached via a top of the LED device(s); and
electrical contacts formed on sides of the LED devices and wherein the LED devices are attached to the interposer by soldering the electrical contacts of the LED devices to the interposer.

3. The LED assembly as recited in claim 1, wherein the interposer comprises a metal-core interposer.

4. The LED assembly as recited in claim 1, wherein the interposer comprises at least one opening formed therein, the openings receiving the LED device(s).

5. An LED assembly comprising:
at least one LED device; and
an interposer to which the LED device(s) are attached via a top of the LED device(s), wherein the interposer comprises at least one opening formed therein for receiving an LED device and further comprising at least one spring formed proximate the opening(s) for facilitating attachment of the LED device(s) to the interposer.

6. An LED assembly comprising:
at least one LED device; and
an interposer to which the LED device(s) are attached via a top of the LED device(s), wherein the interposer comprises at least one opening formed therein for receiving an LED device and further comprising at least one conductive spring formed proximate the opening(s) for facilitating attachment of the LED device(s) to the interposer and for facilitating electrical contact between the LED device(s) and the interposer.

7. The LED assembly as recited in claim 1, wherein the LED device(s) are attached to the interposer, at least in part, by reflow soldering.

8. An LED assembly comprising:
a plurality of LED device(s); and
an interposer to which the LED device(s) are attached via a top of the LED device(s), wherein the plurality of LED device(s) are attached to the interposer via a top and sides of the LED devices.

9. An LED assembly comprising:
at least one LED device;
an interposer to which the LED device(s) are attached via a top of the LED device(s); and
a thermally conductive material attached to the top of the LED device(s) and wherein the LED device(s) are attached to the interposer via the thermally conductive material.

10. The LED assembly as recited in claim 9, wherein the thermally conductive material comprises at least one of Si and SiC.

11. An LED device comprising a substrate and an active area, the substrate and the active area defining a top and two sides of the LED device, wherein the LED device is configured to attach to an interposer at the top and the sides of the LED device.

12. The LED device as recited in claim 11, further comprising solder formed on the top and the two side of the LED device so as to facilitate reflow soldering of the LED device to an interposer.

13. An interposer comprising:
a thermally conductive substrate;
at least one opening formed in the substrate, the opening being configured to receive and attach at least one LED device; and
at least one spring configured to enhance attachment of the LED device to the interposer.

* * * * *